(12) United States Patent
van den Boogaard et al.

(10) Patent No.: US 11,251,014 B2
(45) Date of Patent: Feb. 15, 2022

(54) SAMPLE HOLDER FOR A CHARGED PARTICLE MICROSCOPE

(71) Applicant: FEI Company, Hillsboro, OR (US)

(72) Inventors: Mathijs Petrus Wilhelmus van den Boogaard, Eindhoven (NL); Martijn LaGrange, Eindhoven (NL); Nestor Hernandez Rodriguez, Eindhoven (NL)

(73) Assignee: FEI Company, Hillsboro, OR (US)

( * ) Notice: Subject to any disclaimer, the term of this patent is extended or adjusted under 35 U.S.C. 154(b) by 30 days.

(21) Appl. No.: 16/782,784

(22) Filed: Feb. 5, 2020

(65) Prior Publication Data

US 2020/0273659 A1 Aug. 27, 2020

(30) Foreign Application Priority Data

Feb. 21, 2019 (EP) ..................................... 19158550

(51) Int. Cl.
*H01J 37/20* (2006.01)
*H01J 37/26* (2006.01)

(52) U.S. Cl.
CPC ............ *H01J 37/20* (2013.01); *H01J 37/261* (2013.01)

(58) Field of Classification Search
USPC .................................................. 250/442.11
See application file for complete search history.

(56) References Cited

U.S. PATENT DOCUMENTS

| 6,495,838 | B1 * | 12/2002 | Yaguchi | H01J 37/20 |
| | | | | 250/443.1 |
| 6,838,685 | B1 * | 1/2005 | Kodama | G01N 1/32 |
| | | | | 250/442.11 |
| 7,005,636 | B2 * | 2/2006 | Tappel | G01N 1/32 |
| | | | | 250/304 |
| 7,767,979 | B2 * | 8/2010 | Dona | H01J 37/20 |
| | | | | 250/442.11 |
| 8,853,648 | B2 * | 10/2014 | Nagakubo | G01N 1/286 |
| | | | | 250/443.1 |

(Continued)

FOREIGN PATENT DOCUMENTS

| EP | 2824448 | 1/2015 |
| JP | S6148647 | 4/1986 |

OTHER PUBLICATIONS

PELCO SEMClip SEM Cylinder and Pin Specimen Mounts With Clips, Retrieved Jul. 26, 2019, website tedpella.com.

(Continued)

*Primary Examiner* — Phillip A Johnston

(57) ABSTRACT

The disclosure relates to a sample holder for a charged particle microscope, comprising a holder body with a recess for releasably receiving a sample carrier with a sample therein; and at least one fixing element that is connectable to said holder body for fixing said sample carrier in said recess of said holder body. As described herein, said fixing element comprises a clamping member that is movably connected to said holder body, wherein said clamping member is movable between a closed and an open position, wherein in the open position said sample carrier can be placed in said recess, and wherein in said closed position said sample carrier can be locked in said recess. With this, a more reliable mounting of a sample carrier onto the sample holder can be established.

20 Claims, 6 Drawing Sheets

(56) References Cited

U.S. PATENT DOCUMENTS 9,449,785 B2 *  9/2016  Price .................. H01J 37/20
2015/0170874 A1 *  6/2015  Price ............. G01N 35/00732
250/440.11

OTHER PUBLICATIONS

EP Search Report for Priority application, 19158550.4, dated Aug. 8, 2019.

* cited by examiner

SAMPLE HOLDER FOR A CHARGED PARTICLE MICROSCOPE

BACKGROUND OF THE INVENTION

In a transmission electron microscope (TEM), a parallel, high-energy beam of electrons with an energy of, for example, 300 keV is shot at the sample. As a result of interaction between the electrons and the sample, electrons in the beam will, for example, be deflected, loose energy or be absorbed, which can yield information about the sample. By arranging the electron beam to impinge in the correct manner upon, for example, a fluorescent screen and/or a CCD camera, the information can be rendered visible.

The sample can also be irradiated by a focused beam, which beam is moved across the sample. In this mode of operation of a TEM, the so-called Scanning Transmission Electron Microscopy mode (STEM mode), position-dependent information in the form of secondary particles, such as secondary electrons and X-rays, is produced.

TEM samples need to be very thin, for example less than 100 nm, preferably less than 50 nm. Presently, sample thicknesses of as low as approximately 15 nm can be used. To give a low sample thickness the sample is thinned before it is studied in a TEM. As known to those skilled in the art, use is made of a focused ion beam for ion milling the sample down to the desired thickness, after which the sample can be transferred to the TEM. Thinning and transferring may comprise an in situ or ex situ lift out technique, as is known to those skilled in the art.

For better handling and transport of such a fragile object, for example before and after thinning, the sample is usually mounted on a so-called grid. An in-situ lift out technique may use a so-called half-moon grid, where a chunk of material is attached to a protruding element of said grid, and then thinned to the desired thickness using, for example a Focused Ion Beam (FIB). Once the sample has the desired thickness, the half-moon grid (including the sample) is transferred to the TEM, and the sample can be studied. An ex-situ lift out technique may use a grid in the form of a thin round foil with a diameter of 2-5 mm and a thickness of 10 μm to 40 μm, for example. The central portion of such a foil is embodied as a gauze, whereby the electrons can move through the sample and through the holes in the gauze without being absorbed by the material of the foil. In this technique, the sample is excavated from the material of interest, using the FIB for example. Once the desired thickness is reached, the sample is lifted out of the material, and placed on the foil. The grid is then transferred to a TEM for further study.

To be able to manipulate the position of the sample with respect to the beam, the grid is mounted to an outer end of a so-called TEM rod. The TEM rod is connected to a stage manipulator for applying desired positional movements to the sample.

According to a known method, the grid with the sample is positioned in a recess of the TEM rod, and then a circular ring is used to fix the grid to the TEM rod. Fixing the very fragile grid, which is only about ten micrometers thick, to the TEM rod is a relatively risky and complex process. Placing the circular ring requires a lot of expertise and takes time. In this process, the sample is always subjected to the danger of being damaged.

It is an object to improve this known method. It is particularly an object to improve the speed and/or reliability of this known method, and to decrease the risk of the sample being damaged.

SUMMARY OF THE INVENTION

The invention relates to a sample holder for a charged particle microscope, such as a transmission electron microscope, comprising a holder body with a recess for releasably receiving a sample carrier with a sample therein; and at least one fixing element that is connectable to said holder body for fixing said sample carrier in said recess of said holder body.

The sample holder, which may be a so-called TEM rod, comprises a holder body with a recess, such as an opening provided in an elongated rod. The recess is arranged for releasably receiving therein a sample carrier, such as a grid, with a sample. The sample holder comprises at least one fixing element that is connected, or at least connectable, to said holder body for fixing said sample carrier in said recess of said holder body.

According to the disclosure, said fixing element comprises a clamping member that is movably connected to said holder body. Said clamping member is movable between a closed and an open position. In the open position, the clamping member is positioned in such a way that said sample carrier can be placed in said recess. In the closed position, the clamping member is arranged for directly, or indirectly, locking said sample carrier in said recess.

The movable clamping member that is connected to said holder body allows for improved attachment of the sample carrier with said sample to said sample holder. Attachment can occur in a fast and reliable manner by moving the clamping member to the open position, placing the sample carrier in the recess, and simply moving the clamping member to the closed position again. As the clamping member is connected to the holder body, moving the clamping member between the open position and the closed position is relatively easy, and the movement of the clamping member provides a reliable way of securing the sample carrier in the sample holder. With this, a reliable, secure and fast way of mounting the sample carrier in the sample holder is obtained, with which the object as defined herein is achieved.

Additionally, the use of a movable clamping member provides the possibility for embodying the holder body in a very compact way. A compact construction is beneficial, as it allows, for example, tilting of the sample. Further, a compact construction aids in establishing a large opening angle for EDX analysis, for example. Advantageous embodiments will be explained below.

In an embodiment, the clamping member is pivotable between said open position and said closed position. Pivoting the clamping member allows for a compact construction, as well as for easy manipulation of the clamping member. It is conceivable that the grid is placed on a level surface of the holder body, and that the movable clamping member holds the grid in place in the closed position. This provides a compact construction that prevents so called shadowing during study with the TEM.

In an embodiment, the clamping member comprises a spring element. The spring element may provide a desired clamping force to the clamping member, such that the sample carrier is held securely in place. In a further embodiment, the spring element is arranged for urging said clamping member towards said closed position. This way, the clamping member is forced towards the closed position, holding the sample carrier in place by default. Thus, the reliability of the mounting is increased.

It is conceivable, that said clamping member can be actuated by an actuator member. The actuation member may be actuated automatically, or by a user of the electron microscope, for example.

In an embodiment, the actuator member is arranged for at least pushing said clamping member towards said open position. In combination with a spring element that urges the clamping member towards said closed position, this provides a quick, reliable and easy way of mounting the sample carrier to the sample holder.

In an embodiment, said clamping member is arranged for directly engaging said sample carrier in said closed position. This way, a compact and simple construction with few components is obtained.

In an embodiment, the sample holder comprises at least one further fixing element for fixing said sample carrier in said recess of said holder body. By using a further fixing element, a more secure mounting is possible. It is noted that the fixing element and the further fixing element may be different with respect to each other. For example, the fixing element may be the pivotable clamping member, whilst the further fixing element may be a spring element for example. In an embodiment, however, the fixing element and the further fixing element are substantially similar to each other.

In particular, the further fixing element is embodied as a clamping member according to one or more embodiments as described herein.

In an embodiment, the further fixing element and said clamping member are substantially provided on opposite sides of said recess. This allows fixation of the sample carrier in the recess to be established from opposing sides of the sample carrier, which provides a more reliable and secure mounting in said recess.

According to an aspect, a charged particle microscope for examining a sample is provided, comprising: an optics column, including a charged particle source and an illuminator for directing a beam of charged particles emitted from said charged particle source onto a sample; a sample holder according to the present disclosure, as described above, for holding a sample carrier with said sample therein, and positioned downstream of said illuminator; a detector device for detecting emissions originating from said sample in response to the incidence of charged particles emitted from said charged particle source; and a control unit for performing operations of the charged particle microscope. Advantages of such a charged particle microscope have been elucidated above with respect to the sample holder already.

In an embodiment, the charged particle microscope comprises an actuator member for actuating said clamping member. In particular, said actuator member is arranged for pushing said clamping member towards the open position. In an embodiment, the clamping member is arranged to be urged towards the closed position. This way, the actuator member may be used to push the clamping member towards the open position, and moving the actuator member away from the clamping member ensures that the clamping member is moved to the closed position. This allows for easy and reliable positioning of the sample carrier in the sample holder.

According to an aspect, a method for placing a sample carrier in a sample holder as defined herein is provided, wherein the method comprises the steps of moving said clamping member to said open position, placing said sample carrier in said recess of said sample holder, and moving said clamping member to said closed position.

In an embodiment, a tool is used for placing said sample carrier in said recess of said sample holder. Said tool may for example be a tweezer like tool. The method comprises the step of releasing and/or removing the tool from said sample carrier. According to an embodiment, said step of moving said clamping member to said closed position is performed before said step of releasing and/or removing said tool from said sample carrier. This way a so-called active takeover is effectuated, which ensures that the sample carrier is safely mounted onto the sample holder.

As already discussed above, it is conceivable that an actuator member is used for moving said clamping member to said open position. In particular, relative movement between said actuator member and said sample holder is used for moving said clamping member to the open position. For example, a translation of the actuator may be used to push the clamping member to the open position.

BRIEF DESCRIPTION OF THE DRAWINGS

The invention will next be explained by reference to the accompanying drawings, which show several embodiments of the sample holder as described herein. In the figures.

Figure 1:
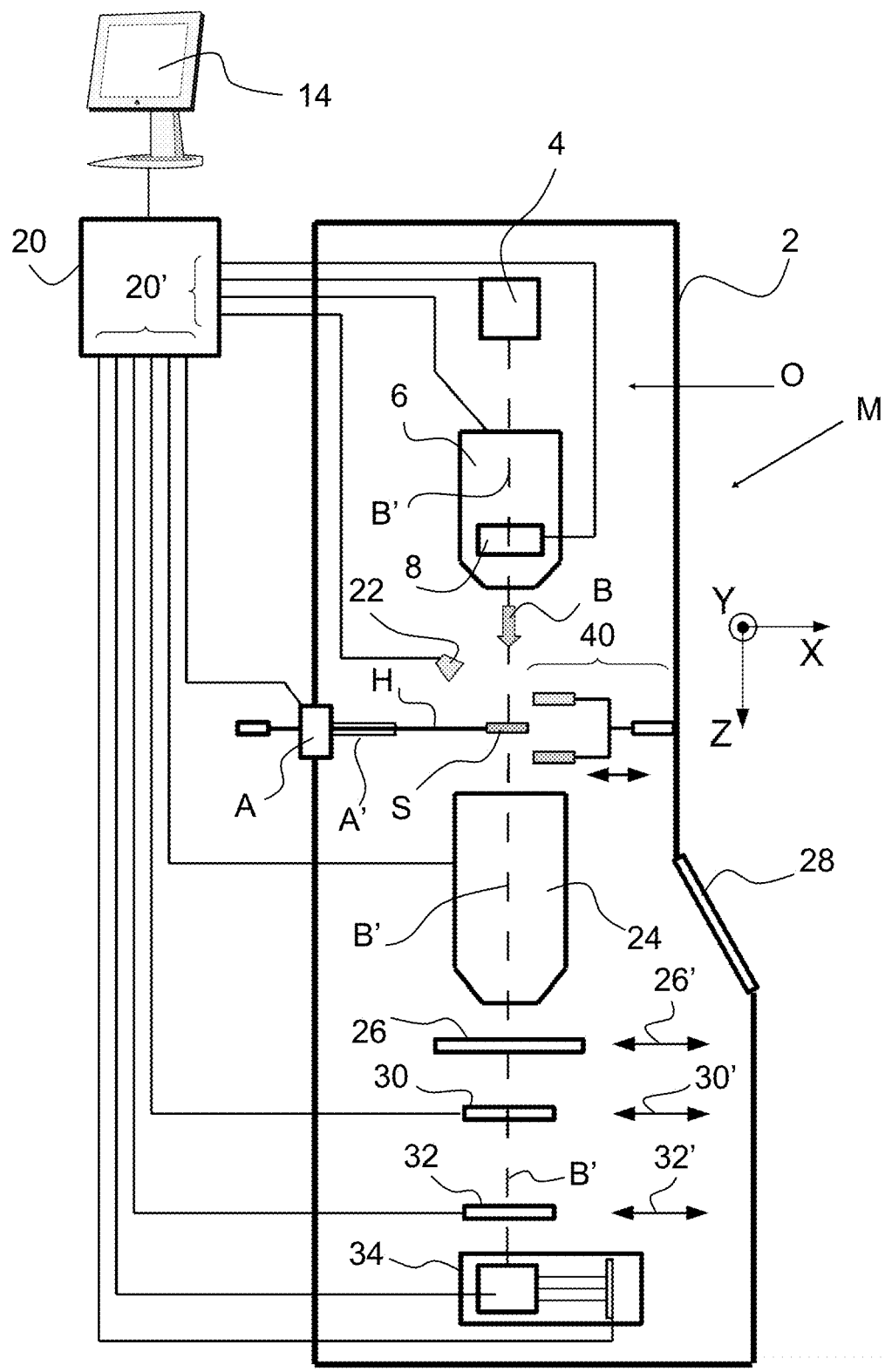
FIG. 1 is a schematic overview of a charged particle microscope.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

FIG. 1 (not to scale) is a highly schematic depiction of an embodiment of a charged-particle microscope M in which the sample holder as disclosed herein can be used. More specifically, FIG. 1 shows an embodiment of a transmission-type microscope M, which, in this case, is a TEM/STEM (though, in the context of the current invention, it could just as validly be a SEM, or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a sample S (which may, for example, be (locally) thinned/planarized). Also depicted is a deflector 8, which (inter alia) can be used to effect scanning motion of the beam B.

The sample S is held on a sample carrier C (not shown) that is mounted to sample holder H, and this sample holder H can be positioned in multiple degrees of freedom by a positioning device A, which moves a stage A' into which holder H is (removably) affixed; for example, the sample holder H may comprise a finger that can be moved (inter alia) in the XY plane (see the depicted Cartesian coordinate system; typically, motion parallel to Z and tilt about X/Y (so called alpha tilt/beta tilt, respectively). Such movement allows different parts of the sample S to be illuminated/imaged/inspected by the electron beam B traveling along axis B' (in the Z direction) (and/or allows scanning motion to be performed, as an alternative to beam scanning). If desired, a cooling device (not depicted, but known to those skilled in the art) can be brought into intimate thermal contact with the sample holder H, so as to maintain it (and the sample S thereupon) at cryogenic temperatures, for example.

The electron beam B will interact with the sample S in such a manner as to cause various types of "stimulated" radiation to emanate from the sample S, including (for example) secondary electrons, backscattered electrons, X-rays and optical radiation (cathodoluminescence). If desired, one or more of these radiation types can be detected with the aid of detector device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the sample S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the sample S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the sample S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the sample along different lines of sight, so as to acquire penetrative observations of the sample from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, sample holder H, screen 26, camera 30, camera 32, spectroscopic apparatus 34, etc.

Figure 2A:
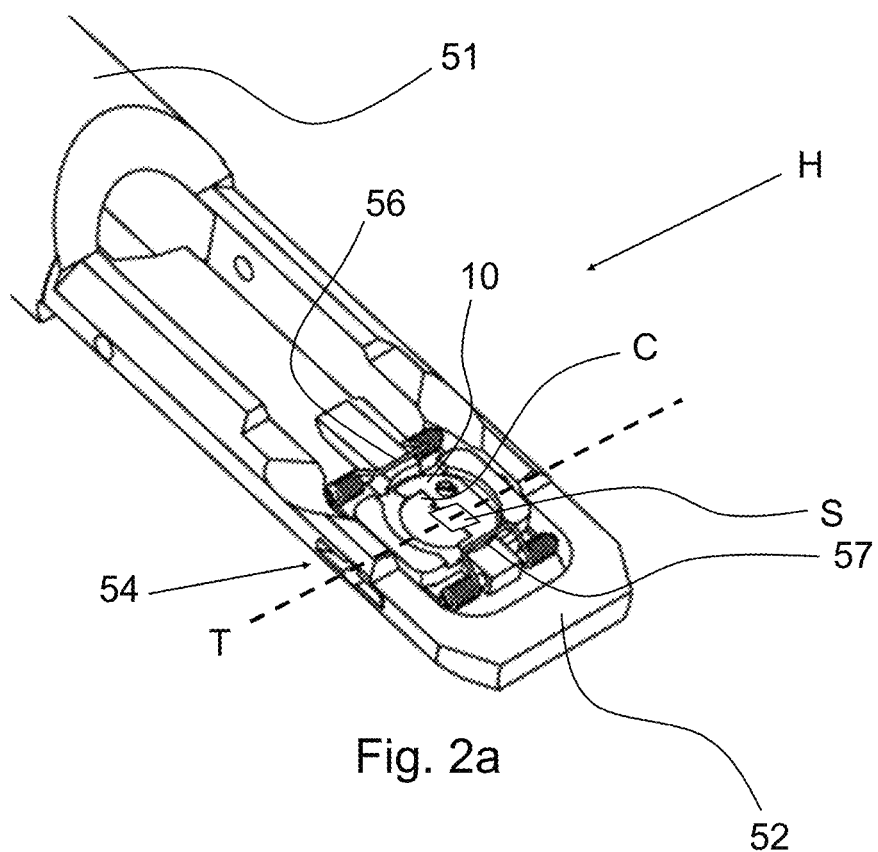
FIGS. 2a and 2b are schematic overviews of an embodiment of the sample holder as disclosed herein.
Figure 2B:
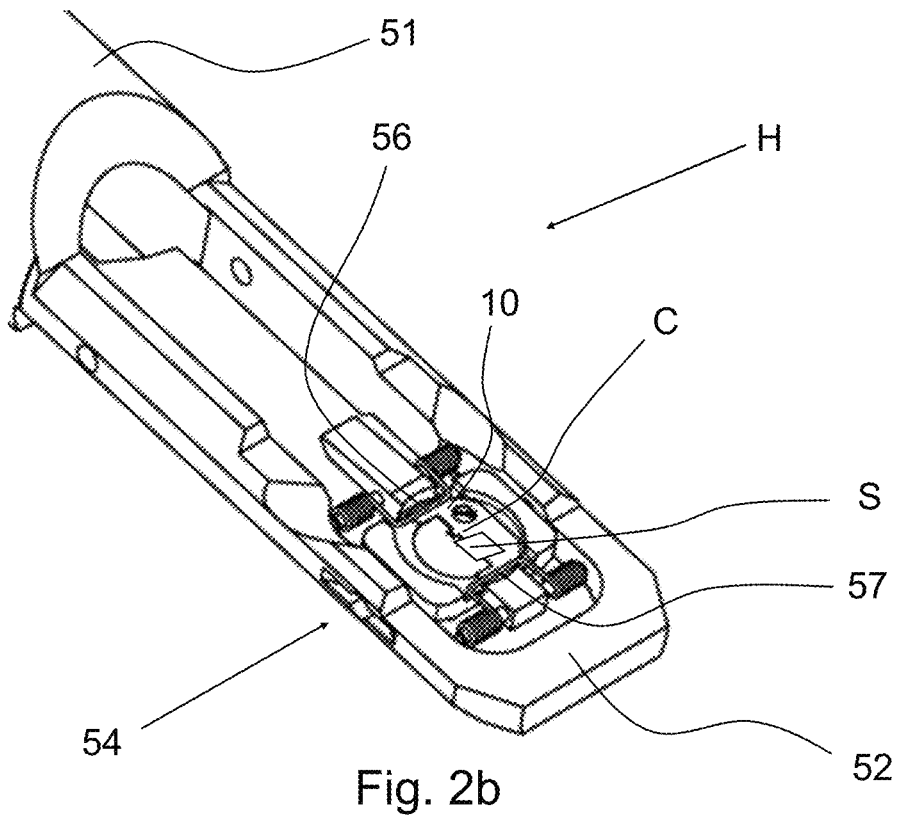

FIGS. 2a and 2b show an embodiment of the sample holder H according to the present disclosure, which can be used in a charged particle microscope, such as the transmission electron microscope shown in FIG. 1; but is equally applicable for a SEM or FIB device.

The sample holder H comprises a holder body 51, that is connectable to the stage A' of the positioning device A as shown in FIG. 1. At an outer end 52 of the holder body 51, a recess 54 is provided. The holder H comprises a cradle 10 that is provided within said recess, and that is connected to the holder body 51. The cradle 10 is pivotable about pivot axis T (so called beta tilt). With said cradle, the recess is arranged for releasably receiving therein a sample carrier C with a sample S (not to scale). In the example shown, the sample carrier C is connectable to the cradle 10. The sample carrier C shown is a halfmoon grid, but it is noted that other grid shapes and grid types are possible, and that the invention is not limited to the use of a halfmoon grid. Other shapes may include ring-shaped, annular, or substantially closed contour shaped grids as well. A mechanical support contour (not shown here), for example a ring shaped contour may be provided as well. In that case, the sample carrier C may be placed inside said mechanical support contour, and mounted to the sample holder H in that way.

As shown in FIGS. 2a and 2b, the sample holder H comprises a first fixing element 56 that is connected to said holder body H for fixing said sample carrier C—either directly, or indirectly in case a mechanical support contour is used, for example—in said recess 54 of said holder body H. The fixing element 56 comprises a clamping member 56 that is movably connected to said holder body, wherein said clamping member is movable between an open position (shown in FIG. 2*a*) and a closed position (shown in FIG. 2*b*). In the open position the clamping member 56 is moved away from the recess 54, such that it enables the sample carrier C to be placed in said recess 54. In the closed position, the clamping member 56 locks the sample carrier C in said recess 54.

In the embodiment shown, the clamping member 56 is a pivotable rotational spring, that is pivotable between the open position and the closed position. By providing a spring element, it is possible to force the clamping member 56 towards the closed position as shown in FIG. 2*b*, keeping the sample carrier C tightly in position, when placed inside said recess.

As shown in FIGS. 2*a* and 2*b*, the sample holder H comprises a further fixing element 57 as well. The further fixing element 57 is arranged for fixing said sample carrier C in said recess 54 of said holder body H. In the embodiment shown, the further fixing element 57 is connected to said holder body H for fixing said sample carrier C—either directly, or indirectly in case a mechanical support contour is used, for example—in said recess 54 of said holder body H. The further fixing element 57 comprises a further clamping member 57 that is movably connected to said holder body H, wherein said further clamping member is movable between an open position (shown in FIG. 2*a*) and a closed position (shown in FIG. 2*b*). In the open position the clamping member 57 is moved away from the recess 54, such that it enables the sample carrier C to be placed in said recess 54. In the closed position, the clamping member 57 locks the sample carrier C in said recess 54.

Hence, in this embodiment, the further fixing element 57 is embodied similar to the fixing element 56, but is provided on opposite sides of the recess for fixing the sample carrier C from opposite sides thereof. The further fixing element 57 is a pivotable rotational spring as well, that is pivotable between the open position and the closed position. By providing a spring element, it is possible to force the clamping member 57 towards the closed position as shown in FIG. 2*b*, keeping the sample carrier C tightly in position, when placed inside said recess. By providing two clamping members 56, 57 in this way, the sample carrier C is kept in the desired position in a reliable way. Additionally, the use of two clamping members 56, 57 in the form of two pivotable rotational springs allows a very compact construction for the sample holder H, which aids in providing desired tilting of the sample carrier, and provides a large opening angle as well, which is beneficial for EDX analysis, for example.

Figure 3A:
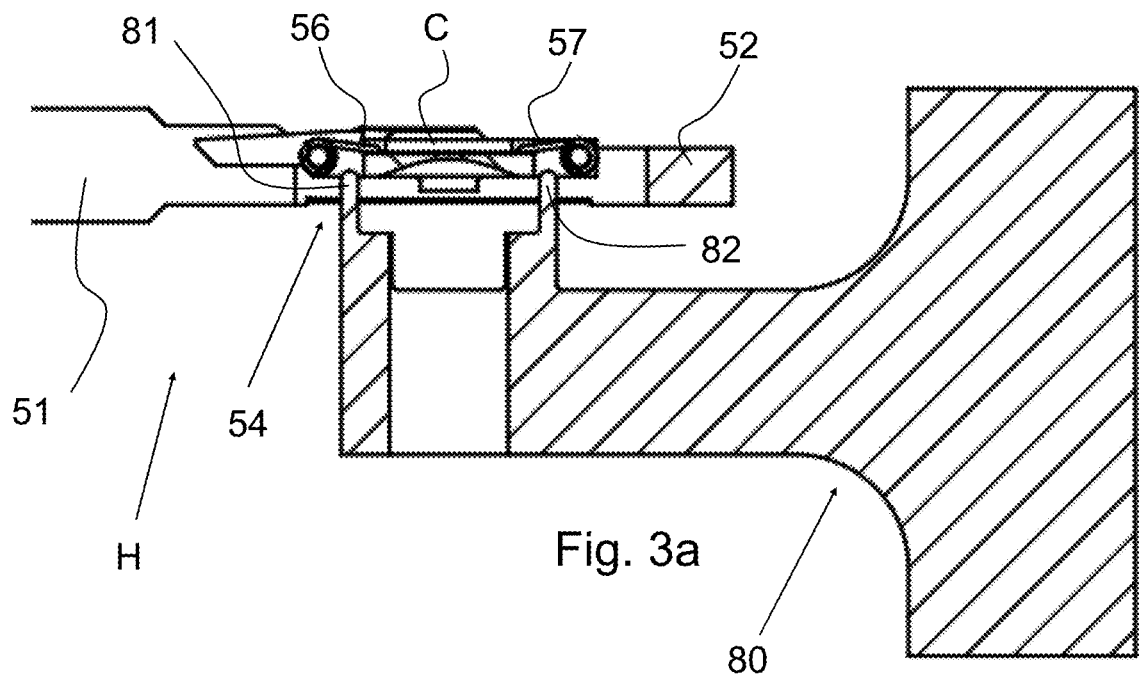
FIGS. 3a and 3b are side views of an actuator for manipulating the clamping member of the sample holder.
Figure 3B:
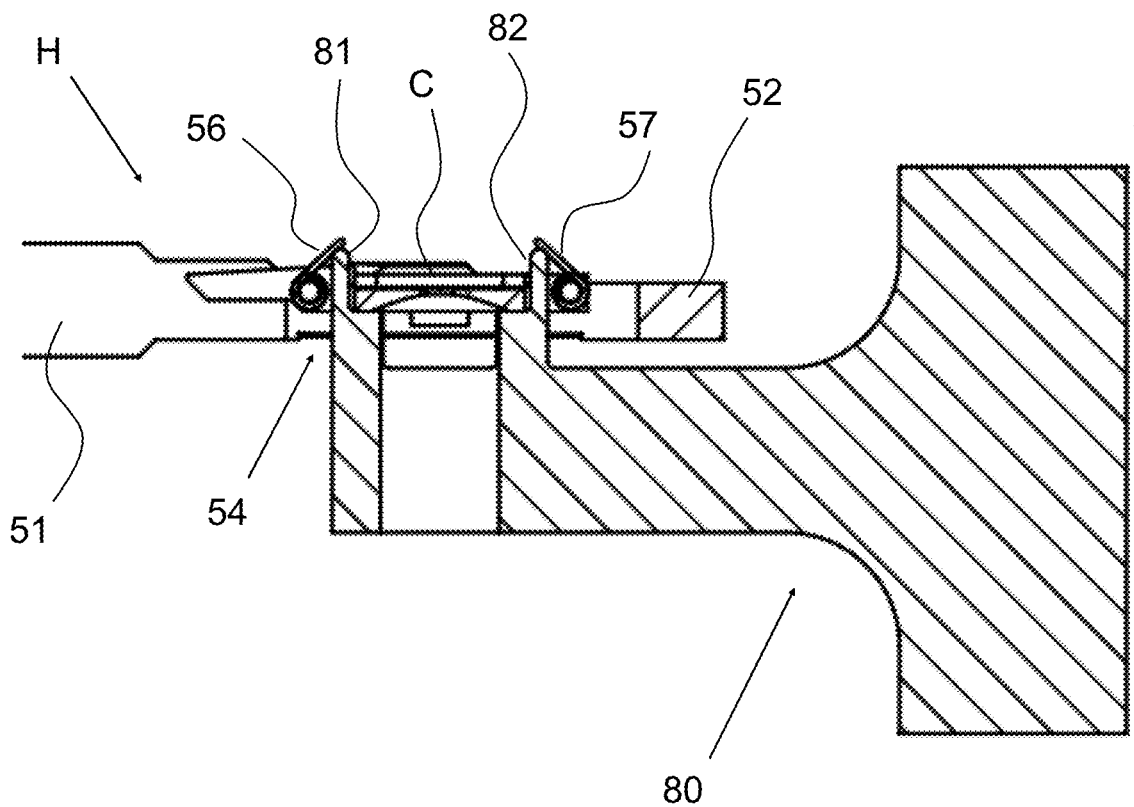

FIGS. 3*a* and 3*b* shows the sample holder H in the embodiment of FIGS. 2*a* and 2*b*, in a closed and open position of the fixing elements 56, 57, respectively. As shown in FIG. 3, an actuator member 80 is used to open and close the respective fixing elements 56, 57. The actuator member 80 comprises an actuator body that extends outward and upward into two actuator protrusions 81, 82. The actuator protrusions 81, 82 are arranged for pushing the spring elements 56, 57 towards the open position (as shown in FIG. 3*b*). This can be done by relative movement between the actuator member 80 and the sample holder H. In an embodiment, the sample holder H is held still, and the actuator member 80 is moved upwards. In the open position (FIG. 3*b*), the sample carrier C can be placed in the recess 54, and then the actuator member 80 may be moved downwards again to snap the fixing elements 56, 57 in place. This way, the carrier is tightly mounted onto the sample holder H.

A tool is often used for positioning the sample carrier C in place. In prior art sample holders, this comprised the positioning of the sample carrier C in said recess, and then releasing said tool from said sample carrier C. This could lead to unwanted repositioning of the sample carrier C, for example a lifting movement with respect to the sample holder H. By using the sample holder H as disclosed herein—and as shown for example, in FIGS. 2*a* and 2*b*—a so-called active takeover is possible. This means that the sample carrier C is positioned in said recess, and actively taken over by the fixing element 56, 57, before releasing the tool from said sample carrier C. In other words, the sample carrier C may be positioned within the recess 54 using the tool (not shown), and whilst the tool is still in contact with the sample carrier C, the fixing elements 56, 57 are used to fixedly mount the sample carrier C to the sample holder H.

Figure 4A:
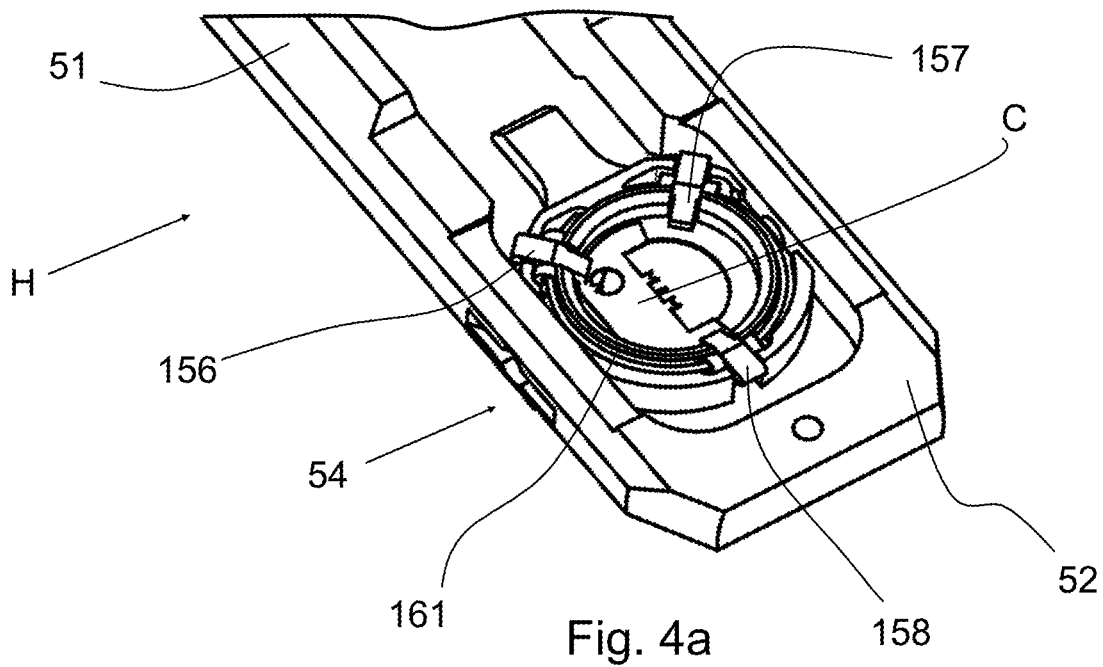
FIGS. 4a and 4b are schematic overviews of a further embodiment of the sample holder as disclosed herein.
Figure 4B:
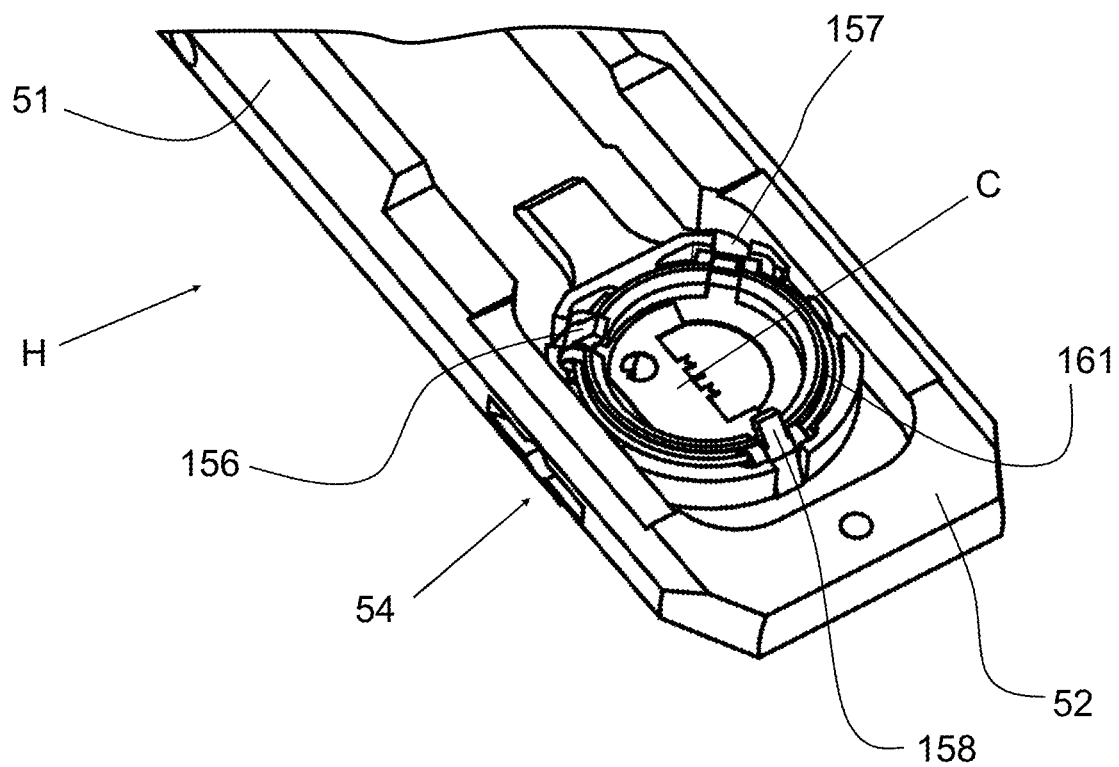

FIGS. 4*a* and 4*b* show a different embodiment of the sample holder H as disclosed herein. The sample holder H shown here is quite similar to the sample holder H shown in FIGS. 2*a* and 2*b*, but mainly differs in the embodiment of the fixing elements 156, 157, 158. Hence, the sample holder H comprises a holder body with a recess 54 for releasably receiving a sample carrier C with a sample therein. The sample holder H comprises a total of three fixing elements 156, 157, 158, that are connected to said holder body 51, and that are arranged for fixing said sample carrier C in said recess 54 of said holder body 51. The fixing elements are embodied as pivotable clamping members 156, 157, 158 that each are movably connected to said holder body 51. In FIG. 4*a*, the clamping members 156, 157, 158 are moved to a closed position in which the sample carrier C is locked in said recess 54. In FIG. 4*b*, the clamping members 156, 157, 158 are move to the open position, wherein the clamping members are pivoted in an upward direction, such that the sample carrier C can be placed in said recess 54.

A C-clip 161 is provided, that interconnects the clamping members 156, 157, 158 with each other. The C-clip runs through bores provided in these clamping members 156, 157, 158, and this way it is possible to embody the C-clip to provide an urging force for pushing said clamping members 156, 157, 158 to the closed position as shown in FIG. 4*a*. By bringing the clamping members 156, 157, 158, towards the open position, for example by pushing or pulling said clamping members 156, 157, 158 by means of an actuator member as shown in FIG. 3, it is possible to overcome the urging force provided by the C-clip, and to bring the clamping members 156, 157, 158 to the open position for loading the sample carrier C onto the sample holder H.

Figure 5A:
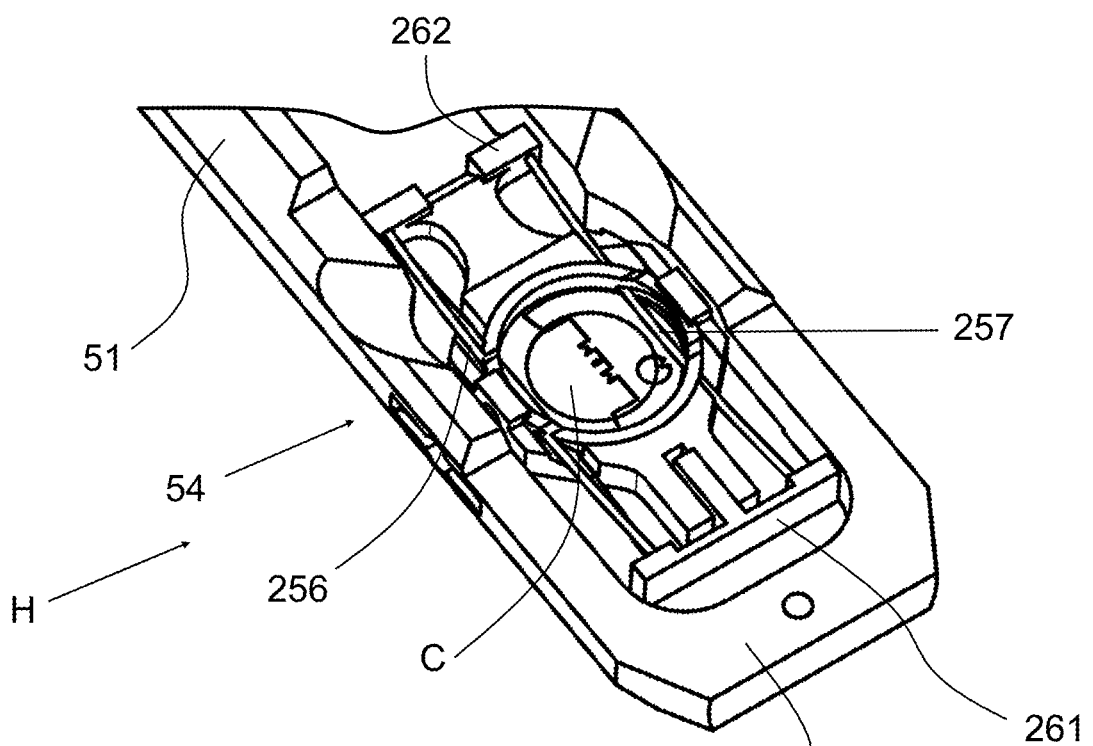
FIGS. 5a and 5b are schematic overviews of a further embodiment of the sample holder as disclosed herein.
Figure 5B:
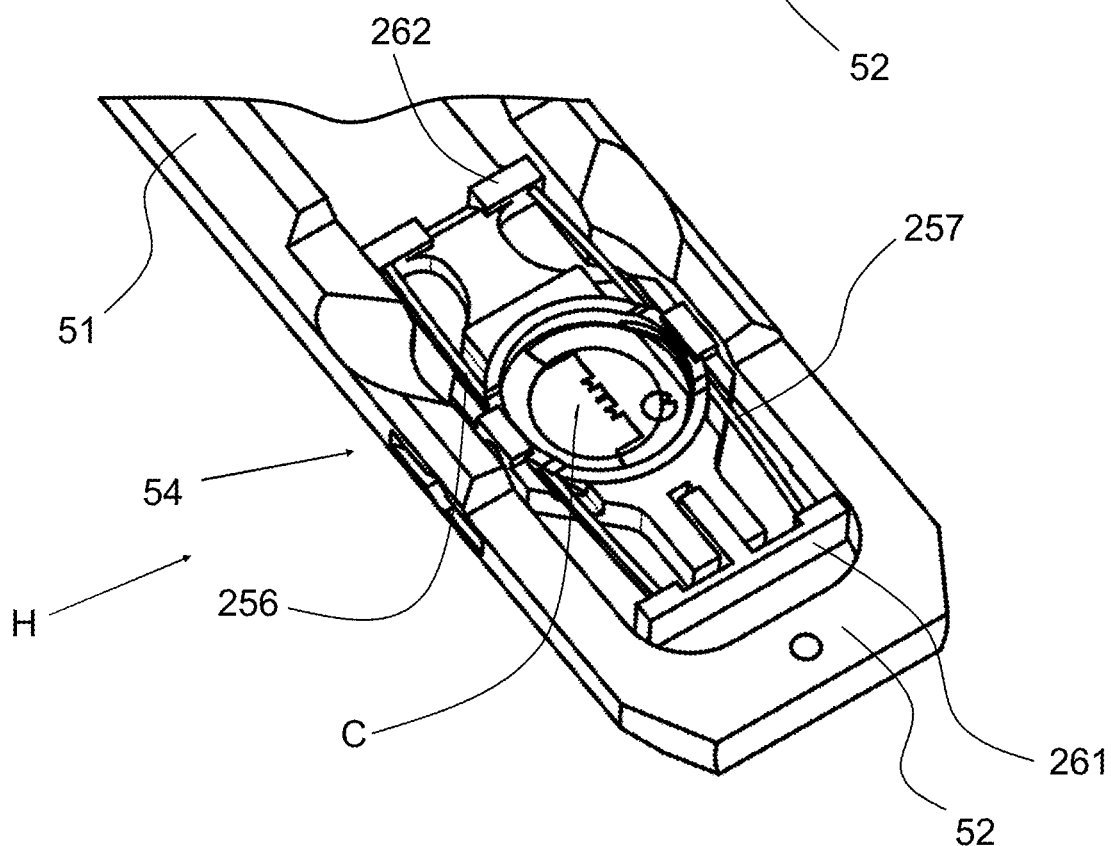

FIGS. 5*a* and 5*b* show an embodiment of the sample holder H wherein two fixing elements 256, 257 are provided that are connected to said holder body 51 for fixing said sample carrier in said recess of said holder body 51. The fixing elements shown here comprise two clamping members 256, 257 in the form of elongate flexible beams. Due to the flexible nature of the beams 256, 257, they are movably connected to said holder body 51 between a closed position (shown in FIG. 3*a*) and an open position (shown in FIG. 3*b*). The flexible beams 256, 257 are provided in end blocks 261, 262. In some embodiments, by relative movement between the end blocks 261, 262 it is possible to load the flexible beams 256, 257, until the flexible beams 256, 257 buckle, and are moved away from the recess 54, towards the open position, to provide room for loading the recess with the sample carrier C.

Figure 6:
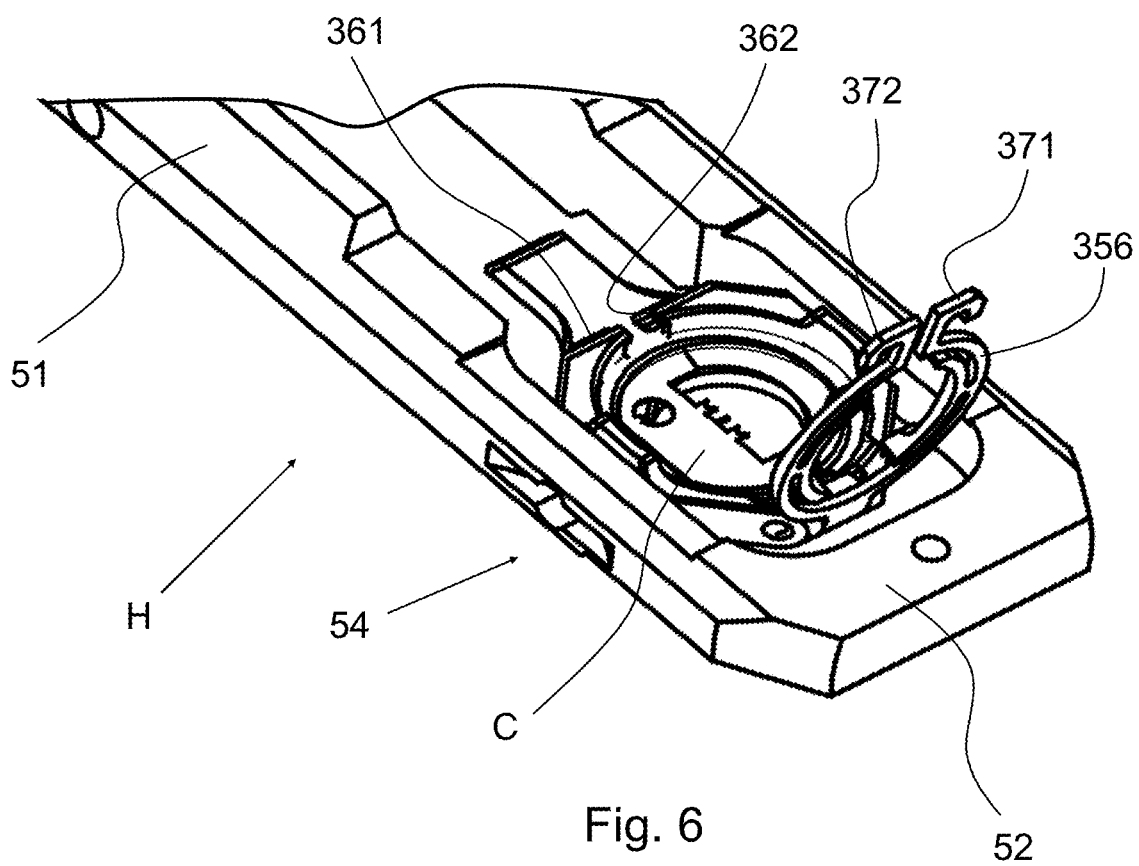
FIG. 6 is a schematic overview of a further embodiment of the sample holder as disclosed herein.

FIG. 6 shows another embodiment of the sample holder H, wherein a single fixing element 356 is used, wherein the fixing element 356 is embodied as a pivotable clamping member 356 that is movable between an open position (as shown in FIG. 6), to a closed position in which the sample carrier C is enclosed by said clamping member 356. The clamping member 356 is C-shaped, with outer ends 371, 372 that are movable towards each other. This way, they can be brought behind locking elements 361, 362 provided on the holder body 51, to lock the clamping member 356 in the closed position. Opening and closing may be exerted by means of an actuator member, for example in the form of a tweezer like tool.

Above, several embodiments of the sample holder H have been described. The desired protection is conferred by the appended claims.

What is claimed is:

1. A sample holder for a charged particle microscope, comprising:
    a holder body with a recess for releasably receiving a sample carrier with a sample therein;
    at least one fixing element that is connectable to said holder body for fixing said sample carrier in said recess of said holder body, wherein said fixing element comprises a clamping member that is movably connected to said holder body, wherein said clamping member is movable between a closed and an open position and comprises a rotational spring that is arranged for urging said clamping member towards said closed position, wherein in the open position said sample carrier can be placed in said recess, and wherein in said closed position said sample carrier can be locked in said recess.

2. A sample holder according to claim 1, wherein said clamping member is pivotable between said open position and said closed position.

3. A sample holder according to claim 1, wherein said at least one fixing element includes a further fixing element that comprises a further clamping member that comprises a further rotational spring element.

4. A sample holder according to claim 3, wherein said further rotational spring element is arranged for urging said clamping member towards said closed position.

5. A sample holder according to claim 1, wherein said clamping member can be actuated by an actuator member.

6. A sample holder according to claim 5, wherein said actuator member is arranged for at least pushing said clamping member towards said open position, wherein pushing said clamping member comprises said actuator member biasing the clamping member in an opposite rotational direction as the urging provided by the rotational spring element.

7. A sample holder according to claim 1, wherein said clamping member is arranged for directly engaging said sample carrier in said closed position.

8. A sample holder according to claim 1, comprising at least one further fixing element for fixing said sample carrier in said recess of said holder body.

9. A sample holder according to claim 8, wherein said further fixing element is configured to be one or more of:
    pivotable between an open position of the further fixing element and a closed position of the further fixing element;
    comprising a further spring element;
    wherein said further spring element is arranged for urging said clamping member towards said closed position;
    able to be actuated by a further actuator member;
    wherein said further actuator member is arranged for at least pushing said clamping member towards said open position of the further fixing element; and
    wherein said further actuator member is arranged for directly engaging said further fixing element in said closed position.

10. A sample holder according to claim 8, wherein said further fixing element and said clamping member are substantially provided on opposite sides of said recess.

11. A charged particle microscope for examining a sample, comprising:
    an optics column, including a charged particle source and an illuminator for directing a beam of charged particles emitted from said charged particle source onto a sample;
    a sample holder for holding a sample carrier with said sample therein, and positioned downstream of said illuminator, wherein said sample holder comprises:
        a holder body with a recess for releasably receiving a sample carrier with a sample therein;
        at least one fixing element that is connectable to said holder body for fixing said sample carrier in said recess of said holder body, wherein said fixing element comprises a clamping member that is movably connected to said holder body, wherein said clamping member is movable between a closed and an open position and comprises a rotational spring that is arranged for urging said clamping member towards said closed position, wherein in the open position said sample carrier can be placed in said recess, and wherein in said closed position said sample carrier can be locked in said recess
    a detector device for detecting emissions originating from said sample in response to the incidence of charged particles emitted from said charged particle source; and
    a control unit for performing operations of the charged particle microscope.

12. A charged particle microscope according to claim 11, further comprising an actuator member for actuating said clamping member.

13. A method for placing a sample carrier in a sample holder, wherein:
    said sample holder comprises:
        a holder body with a recess for releasably receiving a sample carrier with a sample therein;
        at least one fixing element that is connectable to said holder body for fixing said sample carrier in said recess of said holder body, wherein said fixing element comprises a clamping member that is movably connected to said holder body, wherein said clamping member is movable between a closed and an open position and comprises a rotational spring that is arranged for urging said clamping member towards said closed position, wherein in the open position said sample carrier can be placed in said recess, and wherein in said closed position said sample carrier can be locked in said recess; and
    said method comprising the steps of:
        moving said clamping member to said open position;
        placing said sample carrier in said recess of said sample holder;
        moving said clamping member to said closed position.

14. A method according to claim 13, wherein an actuator member is used for moving said clamping member to said open position.

15. A method according to claim 14, wherein relative movement between said actuator member and said sample holder is used.

16. A sample holder according to claim 2, wherein said rotational spring element applies a rotational bias to the clamping member at all pivot positions between said open position and said closed position.

17. A sample holder according to claim 3, wherein said rotational spring element applies a first rotational bias to said clamping element and said further rotational spring element applies a second rotational bias to said further clamping element, and wherein the first rotational bias is in a substantial opposite rotational direction.

18. A sample holder according to claim 3, wherein said clamping element and said further clamping element are moveable independently of each other.

19. A sample holder according to claim 17, wherein said rotational spring element applies a first rotational bias to said clamping element and said further rotational spring element applies a second rotational bias to said further clamping element, such that said clamping element and said further claiming element are independently.

20. A sample holder according to claim 3, wherein said at least one fixing element includes an additional fixing element that comprises an additional clamping member that comprises an additional rotational spring element.

* * * * *